United States Patent
Ha et al.

(10) Patent No.: US 8,353,257 B2
(45) Date of Patent: Jan. 15, 2013

(54) DEPOSITION APPARATUS WITH GUIDE ROLLER FOR LONG SUPERCONDUCTING TAPE

(75) Inventors: Hong Soo Ha, Changwon-si (KR); Sang Soo Oh, Changwon-si (KR); Dong Woo Ha, Changwon-si (KR); Kyu Jung Song, Changwon-si (KR); Rock Kil Ko, Gimhae-si (KR); Ho Sup Kim, Gimhae-si (KR)

(73) Assignee: Korea Electrotechnology Research Institute (KR)

( * ) Notice: Subject to any disclaimer, the term of this patent is extended or adjusted under 35 U.S.C. 154(b) by 1211 days.

(21) Appl. No.: 12/177,853

(22) Filed: Jul. 22, 2008

(65) Prior Publication Data

US 2009/0107395 A1    Apr. 30, 2009

(30) Foreign Application Priority Data

Oct. 31, 2007   (KR) .................. 10-2007-0110241

(51) Int. Cl.
*B05C 1/00* (2006.01)
*B05D 5/00* (2006.01)

(52) U.S. Cl. ...................... 118/234; 427/209
(58) Field of Classification Search .................. None
See application file for complete search history.

(56) References Cited

U.S. PATENT DOCUMENTS

| | | | | |
|---|---|---|---|---|
| 2,896,572 | A * | 7/1959 | Burke | 118/420 |
| 3,700,489 | A * | 10/1972 | Borysko | 427/2.28 |
| 3,884,787 | A * | 5/1975 | Kuehnle | 204/192.12 |
| 5,395,647 | A * | 3/1995 | Krug | 427/172 |

FOREIGN PATENT DOCUMENTS

| | | |
|---|---|---|
| JP | 2005-093958 A | 4/2005 |
| KR | 100750654 B1 | 8/2007 |

* cited by examiner

*Primary Examiner* — Dah-Wei Yuan
*Assistant Examiner* — Charles Capozzi
(74) *Attorney, Agent, or Firm* — Park & Associates IP Law, P.C.

(57) ABSTRACT

Disclosed herein is a deposition apparatus with a guide roller for a long superconducting tape. The deposition apparatus has a supply reel which is provided in a vacuum chamber and rotated to supply the tape, a feed and deposition unit which is spaced apart from the supply reel and vacuum deposits a superconducting layer on the tape while feeding the tape, and a collection reel which is spaced apart from the feed and deposition unit and is rotated to collect the vacuum-deposited tape. The feed and deposition unit includes a drum which is rotated to wind the tape on a predetermined portion of an outer circumference of the drum several times, thus feeding the tape, and a guide roller which is spaced apart from the drum, includes a plurality of rollers each having on an outer circumference thereof grooves and protrusions at regular intervals, and is inclined at a predetermined angle with respect to a rotating shaft of the drum by a sum of a width of the tape and a thickness of each of the protrusions, with the tape passing over an outer circumference of the guide roller. The invention deposits a superconducting layer while maintaining constant tension when the tape is thermally deposited, thus preventing the tape from being deformed because of the difference in the thermal expansion and contraction of the tape resulting from non-uniform tension.

3 Claims, 3 Drawing Sheets

DEPOSITION APPARATUS WITH GUIDE ROLLER FOR LONG SUPERCONDUCTING TAPE

FIELD OF THE INVENTION

The present invention relates generally to a deposition apparatus with a guide roller for a long superconducting tape and, more particularly, to a deposition apparatus with a guide roller for a long superconducting tape, which feeds the long superconducting tape via the guide roller, thus reducing damage to the long superconducting tape, and allowing the long superconducting tape to be deposited without deforming the long superconducting tape.

BACKGROUND OF THE INVENTION

Generally, a superconducting material is used for a transmission line, a motor, a multipurpose pancake coil, a power generator, or a magnet, which belong to the power application equipment field. In order for the superconducting material to be used for the power application equipment field, the loss of alternating current of the superconducting material must be minimized. To this end, a superconducting tape which is flexible and is several hundreds of meters in length is used. It is known that such a superconducting tape has superior effect.

Korean Patent No. 0750654, which was registered on Aug. 13, 2007, discloses a deposition apparatus for a long superconducting tape.

FIG. 1 is a perspective view showing the important parts of a conventional deposition apparatus for a long superconducting tape.

As shown in FIG. 1, the deposition apparatus for the long superconducting tape includes a vacuum chamber 10 which has a drum 30, a deposition source 40, a supply reel 50, a collection reel 60, and a plurality of slip rollers 90 therein. A spiral guide groove is formed in the outer circumference of the drum 30, and a tape 20 is wound in the guide groove. The deposition source 40 is positioned to be perpendicular to the longitudinal direction of the drum 30 while being spaced apart from the drum 30 by a predetermined distance. In this case, the deposition source 40 is located at the center in the longitudinal direction of the drum 30. The supply reel 50 is provided on one end of the drum 30, and functions to continuously supply the tape 20. The collection reel 60 is provided to be opposite the supply reel 50, and functions to collect the deposited tape. The plurality of slip rollers 90, having a cylindrical shape, is provided on the circumference of the drum 30, and protrudes slightly from the circumference of the drum 30 so as to feed the tape 20 along the guide groove of the drum 30.

In the deposition apparatus for the long superconducting tape which is constructed as described above, the tape 20 is slightly spaced apart from the slip rollers 90, so that the tape 20 is not fed while contacting the guide groove, but is fed in a sliding manner while being spaced apart from the guide groove. Thus, the deposition apparatus is advantageous in that it can reduce contact resistance.

However, the conventional deposition apparatus for the long superconducting tape using the drum is problematic in that it uses the slip rollers, but tension acting on the tape varies according to the contact angle, which is determined depending on the shape of the drum and the slip rollers, so that the tape may be extended or deformed at different rates, and may sag or be deformed due to the difference in thermal expansion and contraction according to tension acting on the tape when it is deposited.

Further, the conventional deposition apparatus for the long superconducting tape is problematic in that the length of the fed superconducting tape depends on the diameter of the drum, so that, when the superconducting tape that is to be deposited is long, the drum must be replaced with a drum having a large diameter. Further, the larger the tape that is wound, the more tension is applied to the tape because of bearing friction, and thus the tape may be deformed.

SUMMARY OF THE INVENTION

Accordingly, the present invention has been made keeping in mind the above problems occurring in the prior art, and an object of the present invention is to provide a deposition apparatus with a guide roller for a long superconducting tape, which deposits a superconducting layer while maintaining constant tension when the tape is thermally deposited, thus preventing the tape from being deformed because of the difference in the thermal expansion and contraction of the tape resulting from non-uniform tension.

Another object of the present invention is to provide a deposition apparatus with a guide roller for a long superconducting tape, which prevents tension from increasing even if a large amount of tape is wound around a drum and the guide roller, thus allowing the long superconducting tape to be deposited without damage, and which performs a deposition process without requiring replacement of the drum with another one, even if the length of the tape is increased.

In order to accomplish the above objects, the present invention provides a deposition apparatus with a guide roller for a long superconducting tape, having a supply reel which is provided in a vacuum chamber and rotated to supply the tape, a feed and deposition unit which is spaced apart from the supply reel and vacuum deposits a superconducting layer on the tape while feeding the tape, and a collection reel which is spaced apart from the feed and deposition unit and is rotated to collect the vacuum-deposited tape, wherein the feed and deposition unit includes a drum which is rotated to wind the tape on a predetermined portion of an outer circumference of the drum several times, thus feeding the tape, and a guide roller which is spaced apart from the drum, comprises a plurality of rollers each having on an outer circumference thereof grooves and protrusions at regular intervals, and is inclined at a predetermined angle with respect to a rotating shaft of the drum by a sum of a width of the tape and a thickness of each of the protrusions, with the tape passing over an outer circumference of the guide roller.

The supply reel and the collection reel are inclined at the same inclination angle as the guide roller, thus allowing the tape to be wound or unwound in a parallel fashion.

The guide roller comprises a first guide roller which has on an outer circumference thereof tape winding grooves and protrusions at regular intervals, and is inclined at a predetermined angle with respect to the rotating shaft of the drum so that the tape parallelly passes over the tape winding grooves, and a second guide roller which has on an outer circumference thereof tape winding grooves and protrusions at regular intervals, and is arranged such that associated tape winding grooves of the first and second guide rollers, over which the tape linearly passes, have a difference in position by a sum of a width of the tape and a thickness of each of the protrusions, and is arranged to be parallel to the first guide roller.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
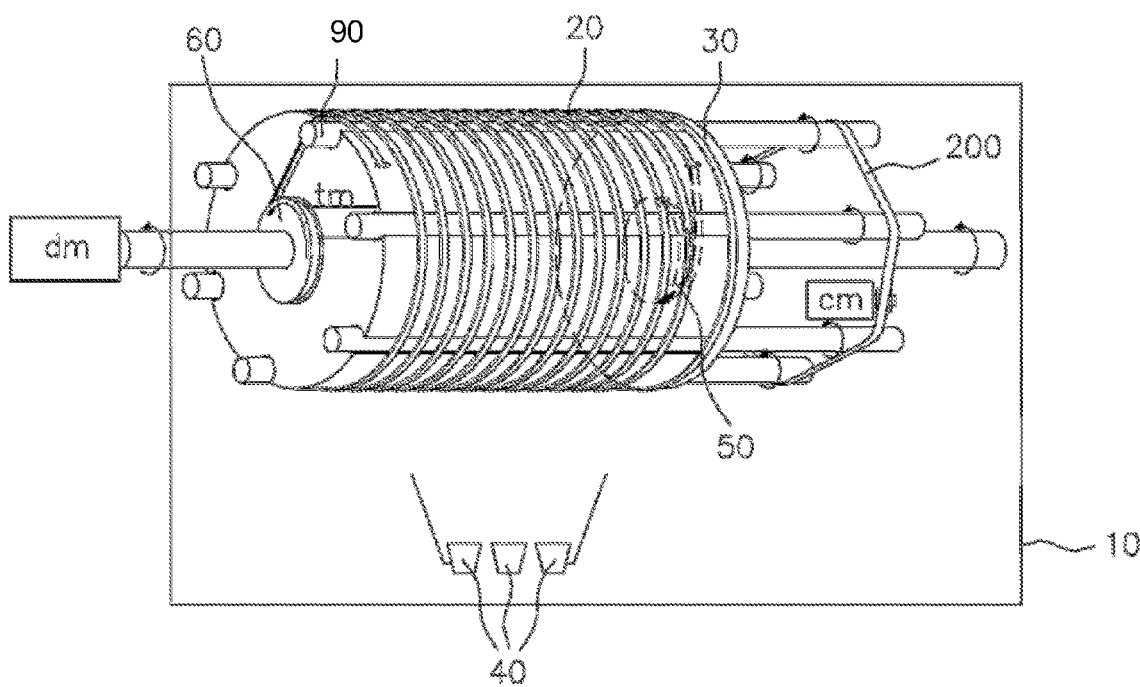
FIG. 1 is a perspective view showing the important parts of a conventional deposition apparatus for a long superconducting tape.

Reference now should be made to the drawings, in which the same reference numerals are used throughout the different drawings to designate the same or similar components.

Figure 2:
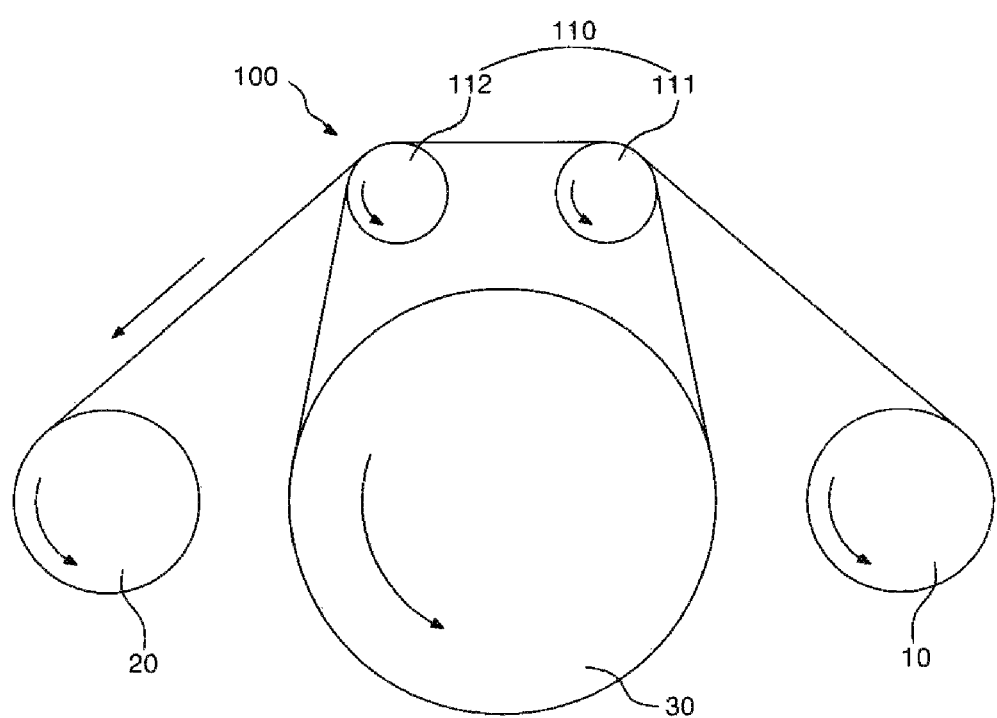
FIG. 2 is a sectional view showing a deposition apparatus with a guide roller for a long superconducting tape, according to the present invention.
Figure 3:
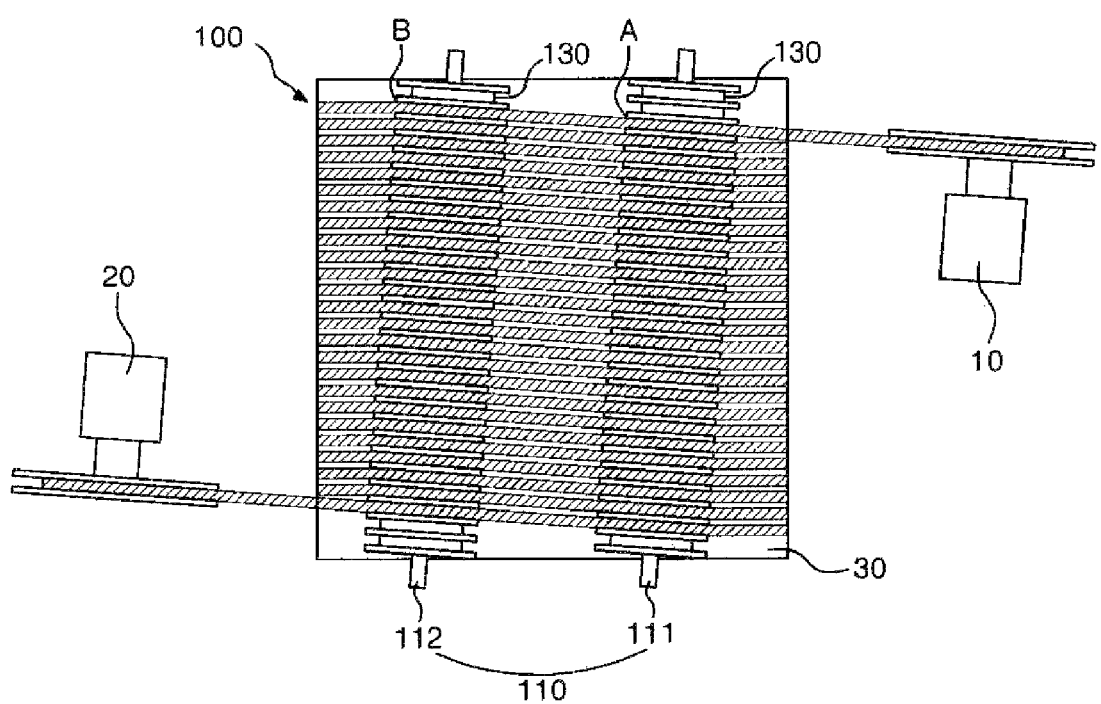
FIG. 3 is a plan view showing the deposition apparatus with the guide roller for the long superconducting tape, according to the present invention.

FIG. 2 is a sectional view showing a deposition apparatus with a guide roller for a long superconducting tape, according to the present invention, and FIG. 3 is a plan view showing the deposition apparatus with the guide roller for the long superconducting tape, according to the present invention.

As shown in FIGS. 2 and 3, the deposition apparatus according to the present invention includes a supply reel 10, a feed and deposition unit 100, and a collection reel 20. The supply reel 10 functions to supply the tape. The feed and deposition unit 100 is rotated to wind the tape, thus feeding and depositing the tape which is supplied to the feed and deposition unit 100. The collection reel 20 functions to wind and collect the superconducting tape which is deposited via the feed and deposition unit 100.

The supply reel 10 is located in a vacuum chamber, has the shape of a circular reel, and is spaced apart from the feed and deposition unit 100, which will be described below in detail, by a predetermined interval.

The tape is wound around the outer circumference of the supply reel 10 several times. Discs are attached to the upper and lower portions of the supply reel 10 to hold the tape in the supply reel 10.

Further, the supply reel 10 is connected to an internal or external motor, so that the supply reel 10 is rotated at a predetermined speed in place, and thus feeds the tape to the feed and deposition unit 100. The tape is unwound from the supply reel 10 under constant tension according to the tape feeding speed of the feed and deposition unit 100, which will be described below, and is thereafter supplied to the feed and deposition unit 100.

The feed and deposition unit 100 includes a drum 30, having a large diameter, and one or more guide roller(s) 110.

The drum 30 has a circular cross-section, and has a diameter ranging from about 250 to 500 mm. The drum 30 extends a long distance in the longitudinal direction of a rotating shaft, which is provided in the center of the drum 30. The drum 30 is rotated by an internal or external motor at a predetermined speed, depending on the deposition conditions.

The drum 30 is spaced apart from the supply reel 10 by a predetermined interval. The tape is fed while being in contact with the surface of the outer circumference of the drum 30. Preferably, grooves are formed in the outer circumference of the drum 30 to receive the fed tape therein. Protrusions are provided between the grooves, thus preventing the fed superconducting tape from overlapping itself.

The guide roller 110 has a smaller diameter than the drum 30. Preferably, the guide roller 110 has a diameter from 30 to 100 mm.

The guide roller 110 comprises a plurality of long rollers, and feeds the tape in cooperation with the drum 30 while depositing superconducting material on the tape.

The guide rollers 110 are arranged side by side. Protrusions are provided between grooves in the outer circumference of each guide roller 110 in such a way as to be placed at regular intervals, thus preventing the fed tape from overlapping itself.

Further, each guide roller 110 is inclined at a predetermined angle with respect to the rotating shaft of the drum 30. In this case, the guide roller 110 is inclined relative to the drum 30 by a sum of the width of the tape passing over the groove formed in the outer circumference of the guide roller 110 and the thickness of each protrusion between neighboring grooves. This will be described below in detail.

As such, each guide roller 110 is inclined, thus preventing the next turn of the tape from being twisted after the tape is wound around the guide rollers 110 and the drum 30 once.

Further, when the tape is wound and deposited while contacting the entire contact portion of the drum 30, the tension applied to the tape varies according to the shape of the drum 30, and thus the tape may be easily deformed. However, the guide rollers 110 reduce the contact angle of the tape with the drum 30, thus reducing the tension applied to the tape, therefore preventing the tape from being deformed.

That is, when the tape is fed only by the drum 30, the contact angle of the tape with the drum 30 is 1800. Thus, if the tape is wound around the drum 30 while the direction in which the tape is fed is changed from an upper or lower position to a lower or upper position, respectively, different tension is applied to the tape according to the shape of the drum 30. Thereby, the fed superconducting tape is deformed.

However, if the guide rollers 110 are used, as in the present invention, the contact angle of the fed tape with the drum 30 is about 90°. Thus, the tension applied to the tape is reduced, thus preventing the fed tape from being deformed.

Preferably, the guide rollers 110 comprise a pair of guide rollers, that is, a first guide roller 111 and a second guide roller 112. The guide rollers 110 are positioned above or under the drum 30 in such a way as to be spaced apart from the drum 30. The supply reel 10 and the collection reel 20 are installed on opposite sides of the guide rollers 110 in such a way as to be spaced apart from the guide rollers 110.

In order to deposit the tape which is fed via the first and second guide rollers 111 and 112, which are spaced apart from the drum 30 as described above, a deposition unit is installed to be spaced apart from the first and second guide rollers 111 and 112. The deposition unit deposits a superconducting material on the fed tape. In this way, tension is kept constant, so that the thermal expansion and contraction of the tape is almost constant. Thereby, the superconducting material can be more stably deposited on the tape, compared to the case where the deposition process is conducted on the tape which is wound under tension that varies according to the position on the outer circumference of the drum.

As the supply reel 10 rotates, the first guide roller 111 is rotated by an internal or external motor while tension is maintained constant. For the first winding, the tape is fed from the supply reel 10 to the second guide roller 112. For subsequent windings, the tape is fed from the drum 30 to the second guide roller 112, which will be described below.

The second guide roller 112 is arranged to be spaced apart from the first guide roller 111 in a horizontal direction. The second guide roller 112 is rotated by an internal or external motor in conjunction with the first guide roller 111 according to the deposition conditions.

In order to minimize the deformation of the tape which is fed through the drum 30, the first and second guide rollers 111 and 112 are positioned along extrapolated lines extending from the outermost portions of the drum 30. The tape is fed perpendicularly through the first and second guide rollers 111 and 112.

Here, when the superconducting tape is fed through the first and second guide rollers 111 and 112, the superconducting tape passing over a tape winding groove 130 of the first guide roller 111 is introduced into a tape winding groove 130 of the second guide roller 112, which is positioned before another tape winding groove 130 thereof, corresponding to the tape winding groove 130 of the first guide roller 111, by one turn.

This will be described in detail with reference to FIG. 3. That is, the superconducting tape, which passes over a third tape winding groove A of the first guide roller 111, is fed to a second tape winding groove B of the second guide roller 112. The guide rollers 110 are inclined such that associated tape winding grooves 130 thereof, over which the superconducting tape linearly passes, have a difference in position by the sum of the width of each tape winding groove 130 and a thickness of each protrusion between the tape winding grooves 130 of each of the first and second guide rollers 111 and 112. Further, the guide rollers 110 are arranged to be parallel to each other, thus minimizing the deformation of the fed tape.

Generally, the greater the number of windings, the more tension is applied to the tape because of bearing friction, and thus the tape may be undesirably deformed. Thus, the number of windings of the superconducting tape should be limited. However, according to this invention, the guide rollers 110 are rotated along with the drum 30. Thus, even if the number of windings of the superconducting tape is increased, tension hardly increases at all. Therefore, it is possible to thinly deposit the tape over a large area using several rollers.

The collection reel 20 rotates in place while providing constant tension to the tape fed along the guide rollers 110, thus collecting the tape. Preferably, the collection reel 20 is inclined at the same angle as the feed and deposition unit 100.

The collection reel 20 may be replaced with another one from outside, thus being capable of collecting and supporting the tape regardless of the length of the fed tape, therefore enabling a long piece of tape to be continuously deposited.

As described above, the present invention provides a deposition apparatus with a guide roller for a long superconducting tape, which deposits a superconducting layer while constant tension is maintained by the guide roller, thus preventing the tape from being deformed or damaged because of the difference in the thermal expansion and contraction of the tape resulting from the non-uniformity of tension.

Further, the present invention provides a deposition apparatus with a guide roller for a long superconducting tape, which is constructed so that the guide roller, a feeding reel, and a collection reel are inclined relative to a rotating shaft of a drum, thus preventing damage to the tape when it is fed to a predetermined position, and which is constructed so that the drum and the guide rollers are rotated together, even if a great amount of tape is wound around the drum and the guide rollers, thus preventing tension from increasing, therefore allowing the tape to be deposited without damage.

The features and advantages of the present invention have been described in general terms so that the appended claims can be easily understood. It will be understood by those skilled in the art that the foregoing and other changes in form and details can be made.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A deposition apparatus for depositing a superconducting layer on a tape, the deposition apparatus comprising:
   a supply reel having a guide groove portion with a tape wound around the guide groove portion to supply the tape upon rotation of the supply reel;
   a feed and deposition unit spaced apart from the supply reel;
   the feed and deposition unit including a cylindrical drum having a spiral guide groove formed around an outer circumference of the drum, and a plurality of guide rollers each having a plurality of guide grooves formed around an outer circumference of the roller, the guide grooves disposed at regular intervals and configured to take the tape therein and feed the tape upon rotation of the roller, said guide rollers spaced equidistantly apart from the drum and each guide roller inclined at a predetermined angle with respect to a rotating shaft of the drum and in parallel relation to one another such that the guide grooves of each guide roller are aligned to the guide grooves of another guide roller; and
   a collection reel spaced apart from the feed and deposition unit, the collection reel having a guide groove portion to wind and collect the tape therein upon rotation of the collection reel,
   wherein the supply reel is positioned at one lateral end side of the feed and deposition unit and inclined in a same inclined angle as the guide rollers are inclined with respect to the rotating shaft of the drum such that the guide groove portion of the supply reel is aligned to associated guide grooves of the guide rollers, said associated guide grooves located at said one lateral side of the feed and deposition unit and over which the tape feeds, to linearly guide the tape from the supply reel to the guide rollers and wind around an outer circumference of the guide rollers and drum in multiple turns without overlapping,
   wherein the collection reel is positioned at an opposite lateral end side of the feed and deposition unit and inclined in a same inclined angle as the guide rollers are inclined with respect to the rotating shaft of the drum such that the guide groove portion of the collection reel is aligned to associated guide grooves of the guide rollers, said associated guide grooves located at said opposite lateral side of the feed and deposition unit and over which the tape feeds, to linearly guide the tape from the guide rollers to the collection reel for winding thereon.

2. The deposition apparatus as set forth in claim 1, wherein the guide rollers of the feed and deposition unit are composed of a first guide roller and a second guide roller each spaced equidistantly apart towards an upper or lower side from the drum, and wherein the supply reel is positioned at one lateral side from the drum and the collection reel at an opposite lateral side from the drum.

3. The deposition apparatus as set forth in claim 1, wherein the guide rollers of the feed and deposition unit are composed of a first guide roller and a second guide roller, and wherein the first and second guide rollers are positioned such that the guide groove of the first guide roller to linearly take the tape from the supply reel has a difference in position from the guide groove of the second guide roller to linearly take the tape from the first guide roller by a sum of a width of one guide groove and a thickness of one protrusion defined between two adjacent guide grooves of the guide rollers.

* * * * *